(12) United States Patent
Jeun et al.

(10) Patent No.: US 11,387,162 B2
(45) Date of Patent: *Jul. 12, 2022

(54) DISCRETE POWER TRANSISTOR PACKAGE HAVING SOLDERLESS DBC TO LEADFRAME ATTACH

(71) Applicant: IXYS, LLC, Milpitas, CA (US)

(72) Inventors: Gi-Young Jeun, Bucheon-si (KR); Kang Rim Choi, Cupertino, CA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/896,594

(22) Filed: Jun. 9, 2020

(65) Prior Publication Data

US 2020/0303281 A1 Sep. 24, 2020

Related U.S. Application Data

(60) Continuation of application No. 16/179,432, filed on Nov. 2, 2018, now Pat. No. 10,720,376, which is a
(Continued)

(51) Int. Cl.
*H01L 23/495* (2006.01)
*H01L 25/18* (2006.01)
(Continued)

(52) U.S. Cl.
CPC .......... *H01L 23/3735* (2013.01); *H01L 21/56* (2013.01); *H01L 23/4334* (2013.01);
(Continued)

(58) Field of Classification Search
CPC ............. H01L 23/045; H01L 23/49562; H01L 23/3107; H01L 23/4924; H01L 24/83;
(Continued)

(56) References Cited

U.S. PATENT DOCUMENTS 3,051,027 A 8/1962 Arthur
4,483,810 A 11/1984 Bunk et al.
(Continued)

FOREIGN PATENT DOCUMENTS

EP 1711040 A1 10/2006
JP 2002009190 A 1/2002
(Continued)

OTHER PUBLICATIONS

"Technical Application: ISOPLUS—The Revolution in Discrete Isolation Technique," IXYS Corporation, 4 pg. downloaded on Dec. 13, 2011.

(Continued)

*Primary Examiner* — Mary A Wilczewski
*Assistant Examiner* — Tsz K Chiu
(74) *Attorney, Agent, or Firm* — KDB PLLC

(57) ABSTRACT

A packaged power transistor device includes a Direct-Bonded Copper ("DBC") substrate. Contact pads of a first lead are attached with solderless welds to a metal layer of the DBC substrate. In a first example, the solderless welds are ultrasonic welds. In a second example, the solderless welds are laser welds. A single power transistor realized on a single semiconductor die is attached to the DBC substrate. In one example, a first bond pad of the die is wire bonded to a second lead, and a second bond pad of the die is wire bonded to a third lead. The die, the wire bonds, and the metal layer of the DBC substrate are covered with an amount of plastic encapsulant. Lead trimming is performed to separate the first, second and third leads from the remainder of a leadframe, the result being the packaged power transistor device.

7 Claims, 6 Drawing Sheets

ULTRASONIC WELD OF DBC SUBSTRATE TO LEADS

Related U.S. Application Data division of application No. 15/452,699, filed on Mar. 7, 2017, now abandoned, which is a continuation of application No. 13/344,567, filed on Jan. 5, 2012, now abandoned.

(51) Int. Cl.

| | | |
|---|---|---|
| *H01L 23/31* | (2006.01) | |
| *H01L 23/373* | (2006.01) | |
| *H01L 23/433* | (2006.01) | |
| *H01L 21/56* | (2006.01) | |
| H01L 23/00 | (2006.01) | |
| H01L 23/492 | (2006.01) | |
| H01L 23/045 | (2006.01) | |

(52) U.S. Cl.
CPC ...... *H01L 23/49562* (2013.01); *H01L 23/045* (2013.01); *H01L 23/3107* (2013.01); *H01L 23/4924* (2013.01); *H01L 24/29* (2013.01); *H01L 24/32* (2013.01); *H01L 24/45* (2013.01); *H01L 24/48* (2013.01); *H01L 24/73* (2013.01); *H01L 24/83* (2013.01); *H01L 2224/0603* (2013.01); *H01L 2224/32245* (2013.01); *H01L 2224/48247* (2013.01); *H01L 2224/48472* (2013.01); *H01L 2224/49111* (2013.01); *H01L 2224/73265* (2013.01); *H01L 2924/1305* (2013.01); *H01L 2924/13034* (2013.01); *H01L 2924/181* (2013.01)

(58) Field of Classification Search
CPC ......... H01L 24/29; H01L 24/32; H01L 24/45; H01L 24/48; H01L 24/73; H01L 2224/83192; H01L 2224/838; H01L 2224/45015; H01L 2224/83191; H01L 2224/48472; H01L 2224/85205; H01L 2224/83101; H01L 2224/4823; H01L 2224/48137; H01L 2224/73265; H01L 2224/45147; H01L 2224/45124; H01L 2224/45014; H01L 2224/48247; H01L 2224/85099; H01L 23/49575; H01L 24/41; H01L 24/40; H01L 2224/84205

See application file for complete search history.

(56) References Cited

U.S. PATENT DOCUMENTS

| | | | | |
|---|---|---|---|---|
| 4,546,374 | A * | 10/1985 | Olsen | H01L 23/045 257/772 |
| 5,018,002 | A * | 5/1991 | Neugebauer | H01L 23/049 257/698 |
| 5,209,390 | A * | 5/1993 | Temple | H01L 23/04 228/124.6 |
| 5,971,251 | A * | 10/1999 | Moore | H01R 4/023 228/112.1 |
| 6,040,626 | A * | 3/2000 | Cheah | H01L 23/49562 257/735 |
| 6,316,838 | B1 * | 11/2001 | Ozawa | H01L 24/48 257/777 |
| 6,404,065 | B1 | 6/2002 | Choi | |
| 6,727,585 | B2 | 4/2004 | Choi | |
| 7,374,466 | B2 | 5/2008 | Onuma et al. | |
| 7,511,371 | B2 | 3/2009 | Wallace | |
| 7,709,947 | B2 | 5/2010 | Ishikawa | |
| 7,847,375 | B2 * | 12/2010 | Mahler | H01L 24/37 257/796 |
| 8,575,767 | B1 | 11/2013 | Zommer | |
| 8,586,480 | B1 * | 11/2013 | Zommer | H01L 23/48 438/686 |
| 8,716,864 | B2 * | 5/2014 | Zommer | H01L 25/50 257/765 |
| 8,866,274 | B2 | 10/2014 | Gruber et al. | |
| 9,716,057 | B1 * | 7/2017 | Zhang | H01L 23/49541 |
| 9,967,977 | B1 * | 5/2018 | McPherson | H05K 1/111 |
| 10,204,848 | B2 * | 2/2019 | Choi | H01L 23/3114 |
| 10,283,440 | B2 * | 5/2019 | Soyano | H01L 23/49575 |
| 10,629,520 | B2 * | 4/2020 | Haga | H01L 24/85 |
| 10,720,376 | B2 * | 7/2020 | Jeun | H01L 23/3735 |
| 10,971,457 | B2 * | 4/2021 | Bemmerl | H01L 23/49562 |
| 2004/0150939 | A1 | 8/2004 | Huff | |
| 2006/0208033 | A1 * | 9/2006 | Welter | B23K 11/002 228/110.1 |
| 2006/0220216 | A1 * | 10/2006 | Mizuno | H05K 1/0263 257/691 |
| 2006/0261473 | A1 * | 11/2006 | Connah | H01L 23/15 257/728 |
| 2007/0130759 | A1 | 6/2007 | Harnden | |
| 2008/0122075 | A1 * | 5/2008 | Bauer | H01L 23/5385 257/724 |
| 2009/0243061 | A1 | 3/2009 | Yang | |
| 2009/0244508 | A1 | 3/2009 | Schoeppach | |
| 2011/0075451 | A1 * | 3/2011 | Bayerer | H01L 24/06 363/37 |
| 2011/0121326 | A1 * | 5/2011 | Tan | H01L 33/60 257/88 |
| 2011/0186880 | A1 * | 8/2011 | Kohler | F21K 9/00 257/91 |
| 2012/0006679 | A1 | 1/2012 | Ellis | |
| 2012/0217655 | A1 | 2/2012 | Minotti | |
| 2012/0199989 | A1 | 3/2012 | Schulz | |
| 2013/0020694 | A1 * | 1/2013 | Liang | H01L 25/072 257/691 |
| 2013/0084679 | A1 * | 4/2013 | Stolze | H01L 21/4853 438/121 |
| 2013/0175704 | A1 * | 7/2013 | Jeun | H01L 23/4334 257/777 |
| 2013/0252381 | A1 * | 9/2013 | Spann | H01L 24/97 438/122 |
| 2013/0264697 | A1 * | 10/2013 | Notsu | H01L 23/48 257/690 |
| 2013/0328204 | A1 | 12/2013 | Zommer | |
| 2014/0001481 | A1 * | 1/2014 | Michikoshi | H01L 23/49531 257/76 |
| 2015/0371921 | A1 * | 12/2015 | Tanaka | H01L 21/565 257/712 |
| 2016/0155687 | A1 * | 6/2016 | Takizawa | H01L 23/49861 257/666 |
| 2017/0178998 | A1 * | 6/2017 | Jeun | H01L 23/49562 |
| 2017/0207150 | A1 | 7/2017 | Choi | |
| 2018/0012828 | A1 | 1/2018 | Beer et al. | |
| 2018/0301444 | A1 | 10/2018 | Roth et al. | |
| 2018/0342442 | A1 | 11/2018 | Haga | |
| 2019/0273040 | A1 | 9/2019 | Mohn et al. | |

FOREIGN PATENT DOCUMENTS

| | | | | |
|---|---|---|---|---|
| WO | | 2001093324 A2 | 12/2001 | |
| WO | WO-2018024715 A1 * | | 2/2018 | B23K 20/10 |

OTHER PUBLICATIONS

Rai et al., "Finite Element Analysis of Pulsed Laser Spot Welding," 21pg, downloaded on Dec. 13, 2011.

"Types of Ultrasonic Welds," 3pg, downloaded Dec. 13, 2011.

* cited by examiner

DBC SUBSTRATE
(PERSPECTIVE DIAGRAM)

LEADFRAME
(PERSPECTIVE DIAGRAM)

DBC SUBSTRATE AND LEADFRAME
(CROSS-SECTIONAL DIAGRAM)

ULTRASONIC WELDING OF DBC SUBSTRATE TO LEADFRAME
(CROSS-SECTIONAL DIAGRAM)

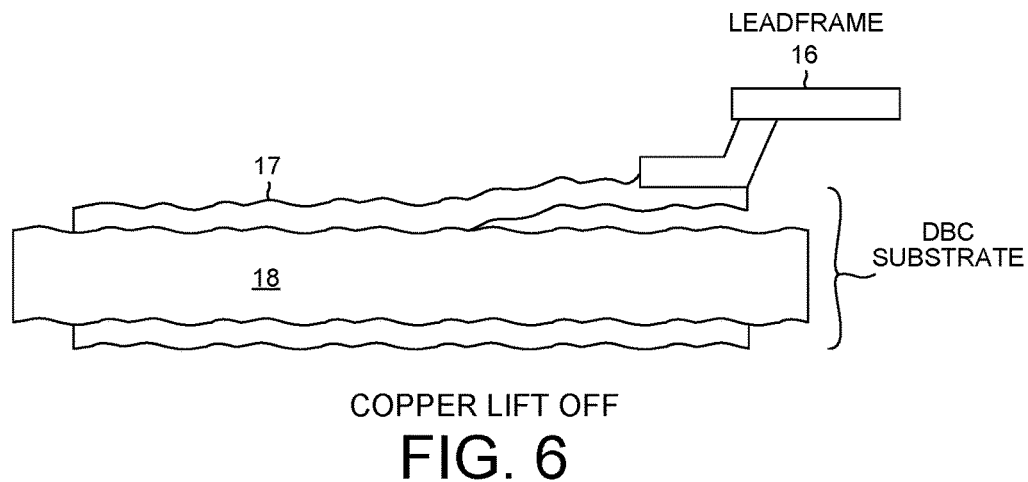

COPPER LIFT OFF

FIG. 6

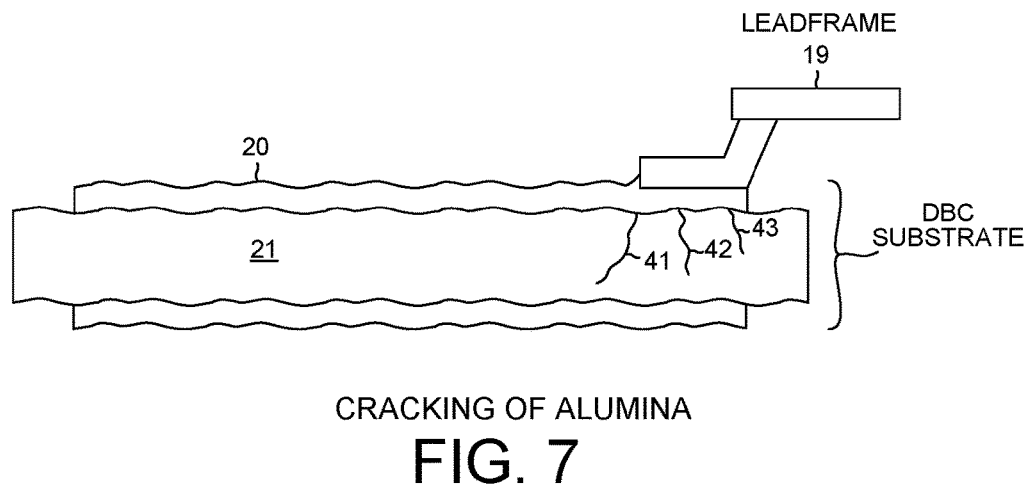

CRACKING OF ALUMINA

FIG. 7

| TOP CLAMPING PRESSURE | 0.5 Mpa | MIN. 0.3 Mpa - MAX. 0.6 Mpa |
|---|---|---|
| SIDE CLAMPING PRESSURE | 0.3 Mpa | MIN. 0.25 Mpa - MAX. 0.35 Mpa |
| WELDING TIME | 0.25 seconds | ≤0.05Mpa |
| HOLDING TIME AFTER WELD | 0.1 seconds | |
| ULTRASONIC VIBRATION AMPLITUDE | 20 um | ≤20um    70% OF FULL AMP |
| WELDING PRESSURE | 0.05 Mpa | ≤0.05Mpa |
| FREQUENCY | 20 kHz | |
| FIRST METAL LAYER THICKNESS | >0.25 mm | NICKEL PLATED COPPER |

TABLE OF ULTRASONIC WELDING PARAMETERS

FIG. 8

ULTRASONIC WELD OF DBC SUBSTRATE TO LEADS

BOTTOM SIDE OF DBC SUBSTRATE WELDED TO THE CENTER LEAD
(OTHER LEADS NOT SHOWN)

TO-247 INTEGRATED CIRCUIT PACKAGE

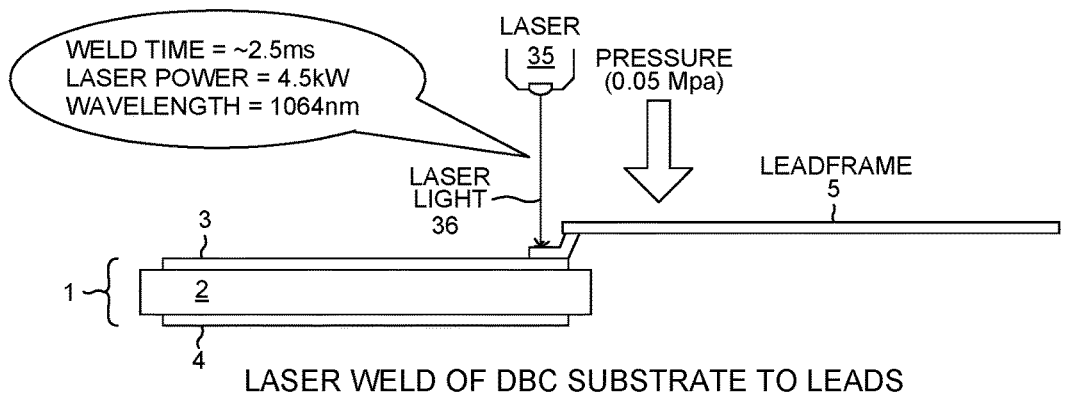

FIG. 13 LASER WELD OF DBC SUBSTRATE TO LEADS

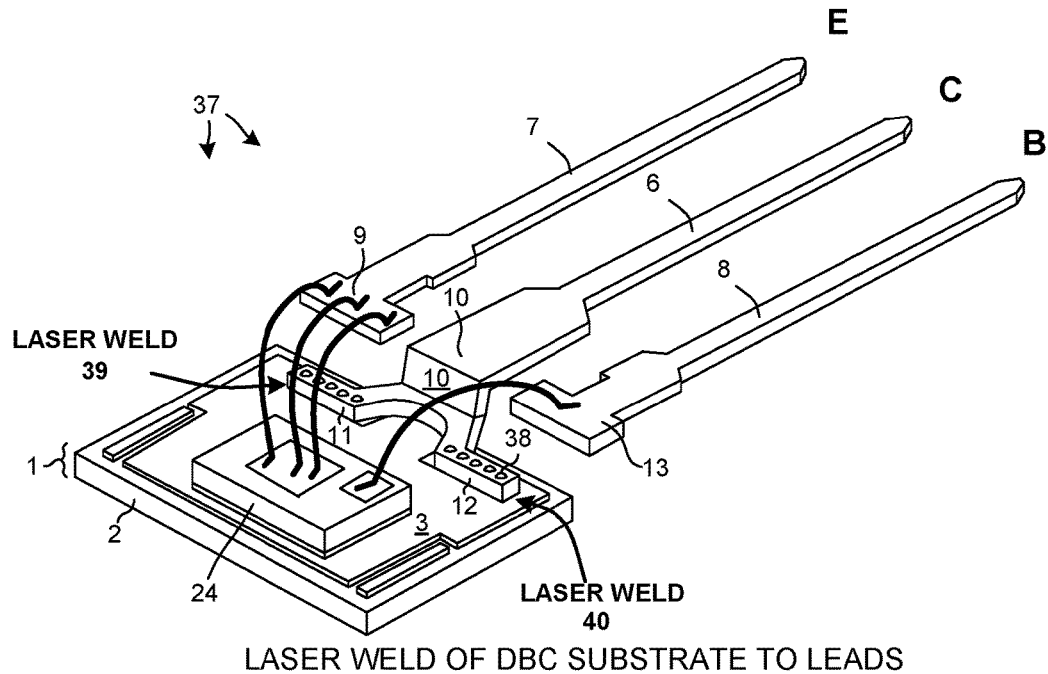

FIG. 14 LASER WELD OF DBC SUBSTRATE TO LEADS

| TOP CLAMPING PRESSURE | 0.5 Mpa |
| --- | --- |
| SIDE CLAMPING PRESSURE | 0.3 Mpa |
| LASER OUTPUT POWER SETTING | 4.5kW (AVERAGE OF OUTPUT POWER WAVEFORM) |
| LASER WELD TIME TO DO 5 WELDS | 11.5 milliseconds |
| WAVELENGTH | 1064nm |
| LASER TYPE | YAG Laser (Model: ML-2550A) |
| LASER MANUFACTURER | Miyachi Corporation, Tokyo, Japan |

TABLE OF LASER WELDING PARAMETERS

FIG. 15

DISCRETE POWER TRANSISTOR PACKAGE HAVING SOLDERLESS DBC TO LEADFRAME ATTACH

CROSS-REFERENCE

This application is a continuation of, and claims priority under 35 USC SS120 from, nonprovisional U.S. patent application Ser. No. 16/179,432 entitled "Discrete Power Transistor Package Having Solderless DBC to Leadframe Attach" filed on Nov. 2, 2018 which is a divisional of, and claims priority under 35 U.S.C. SS 120 from, nonprovisional U.S. patent application Ser. No. 15/452,699 entitled "Discrete Power Transistor Package Having Solderless DBC To Leadframe Attach," filed on Mar. 7, 2017, which is a continuation of U.S. patent application Ser. No. 13/344,567, entitled "Discrete Power Transistor Package Having Solderless DBC To Leadframe Attach," filed on Jan. 5, 2012, the entire contents of which are incorporated herein by reference.

TECHNICAL FIELD

The described embodiments relate to packaged discrete power transistor devices.

BACKGROUND INFORMATION

A package known as the TO-247 package is often used to package a power transistor die. A conventional TO-247 package includes three parallel extending metal leads, where the center lead extends from a center metal tab. The leads and the center tab are stamped from the same thick copper sheet. The power transistor die is mounted to a top side of the center tab. The center tab and the die are then overmolded with a plastic encapsulant such that the three leads extend parallel to one another from the amount of plastic encapsulant. A backside surface of the metal tab is, however, left exposed and is not covered with encapsulant. This backside surface of metal forms the backside of the packaged device. The backside of the tab is often electrically coupled to the bottom side of the integrated circuit die. In operation, a high voltage may be present on the bottom side of the die and the backside of the package may be fixed to a metal heatsink. For various reasons including safety reasons, it is undesirable that the high voltage from the bottom side of the die be present on the heatsink. Accordingly, insulating pads or washers are sometimes provided between the backside of the package and the heatsink to which the package is attached. These insulating pads or washers are thermally conductive, but prevent the high voltage from the backside of the package from being coupled to the heatsink. Alternatively, a thin insulating member can be provided inside the package between the bottom side of the die and top side of the metal tab. This thin insulating member is thermally conductive, but prevents the high voltage from the bottom side of the die from being coupled to the metal tab that forms the backside of the package. The package can then be connected to the heatsink without an intervening insulating pads or washers. These different structures for providing high voltage isolation are undesirable in certain circumstances of for various reasons.

U.S. Pat. No. 6,404,065 discloses a TO-247 outline package whose backside is electrically insulated from the bottom side of the die within the package. Rather than having a metal tab that extends from the center lead of the leadframe, the package involves a Direct-Bonded Copper ("DBC") substrate. DBC substrates are also sometimes referred to as Direct Copper Bonded ("DCB") substrates. In one example, the DBC substrate involves a substrate layer of ceramic insulator. This ceramic layer is sandwiched between a first (die-side) layer of copper and a second (back-side) layer of copper. The first die-side layer of copper is soldered to the center lead of the leadframe. The die is also die-attached to this first die-side layer of copper. After overmolding with plastic encapsulant, the second back-side layer of copper forms the backside of the package. Due to the insulating ceramic layer of the DBC substrate, the first and second layers of copper are thermally coupled to one another but the back-side copper layer is insulated from the die-side copper layer and the integrated circuit. This DBC substrate package has been in use for about ten years, and has been quite successful.

SUMMARY

A packaged power integrated circuit device includes a Direct-Bonded Copper ("DBC") substrate. The term "integrated circuit", as it is used here, does not have to involve multiple transistors or multiple electrical components integrated together onto a semiconductor die, but rather the term integrated circuit encompasses a single discrete power transistor realized by itself (without other transistors) on a single semiconductor die using semiconductor processing manufacturing technologies. The DBC substrate of the packaged power integrated circuit device includes an insulative substrate layer and at least one metal layer. Contact pads of a first lead are attached with solderless welds to the metal layer of the DBC substrate. One and only one power semiconductor integrated circuit die is attached to the DBC substrate. In one example, a first bond pad on an upper surface of the die is wire bonded to a second lead, and a second bond pad on the upper surface of the die is wire bonded to a third lead. The integrated circuit die, the wire bonds, and the metal layer of the DBC substrate are then covered with an amount of a plastic encapsulant. Lead trimming is then performed to separate the first, second and third leads from the remainder of a leadframe. The result is the packaged power integrated circuit device. The packaged power integrated circuit device may have an outline that conforms to the TO-247 package outline.

In one example, the DBC substrate further includes a second metal layer. The second metal layer is disposed on the opposite side of the insulative substrate layer from the first metal layer of the DBC substrate. After encapsulation, the second metal layer is exposed and is not covered by the plastic encapsulant. At least a part of the second metal layer forms a part of the backside of the packaged power integrated circuit device. In the final packaged power semiconductor integrated circuit package, the second metal layer is electrically insulated from the first metal layer, and from each of the three leads of the package.

In a first example, the solderless weld between the first metal layer of the DBC substrate and the contact pads of the first lead is an ultrasonic weld. Each contact pad of the first lead is ultrasonically welded to the metal layer of the DBC substrate by clamping the DBC substrate and the contact pad together with not more than about 0.05 Mpa. Each weld is carried out by applying ultrasonic energy with a vibration amplitude of less than or equal to 20 micrometers at an oscillating frequency of approximately 20 kHz for approximately 0.3 seconds. The contact pads of the first lead are nickel plated copper and are at least 0.25 mm thick (for example, 0.30 mm thick). In one example, after ultrasonic welding, the upper surfaces of the contact pads of the first lead bear a pattern of indentations. Each indentation may have a V-shape such that the indentations together form a waffle-like structure. The operation is repeatable and is carried out without metal layer lift off and without cracking of the insulative substrate layer of the DBC.

In a second example, the solderless weld between the first metal layer of the DBC substrate and the contact pads of the first lead is a laser weld. The welding is carried out by clamping the DBC substrate and the contact pads together with not more than about 0.05 Mpa. Each contact pad is welded to the DBC substrate in numerous places. At each place, the contact pad is heated to its molten state using a pulse of 1064 nm laser energy at approximately 4.5 kW average power. In one example, after laser welding, the upper surface of each contact pad of the first lead bears a row of mound-shaped protrusions and associated pits.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 6 is a cross-sectional diagram that shows a copper lift off problem associated with a previous nonpublic and non-commercial attempt to ultrasonically weld a DBC substrate to a leadframe.

FIG. 7 is a cross-sectional diagram that shows an alumina cracking problem associated with the previous nonpublic and non-commercial attempt to ultrasonically weld a DBC substrate to a leadframe.

FIG. 8 is a table that sets forth parameters of a ultrasonic welding process used to attach DBC substrates to leadframe contact pads in accordance with one novel aspect.

FIG. 13 is a cross-sectional diagram of a second way that a DBC substrate can be connected to contact pads with a solderless weld.

FIG. 14 is a perspective view of a finished TO-247 packaged power integrated circuit device, where the DBC substrate is laser welded to the contact pads of the center lead (the plastic encapsulant overmolding is not shown).

FIG. 15 is a table that sets forth parameters of the laser welding process used to laser weld the DBC substrate to the contact pads in the structure of FIG. 14.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "front", "back", "upper", "lower", "top", "bottom", "underneath", "underlying" and "down" are used herein to describe relative orientations between different parts of the structure being described, and it is to be understood that the overall structure being described can actually be oriented in any way in three-dimensional space.

Figure 1:
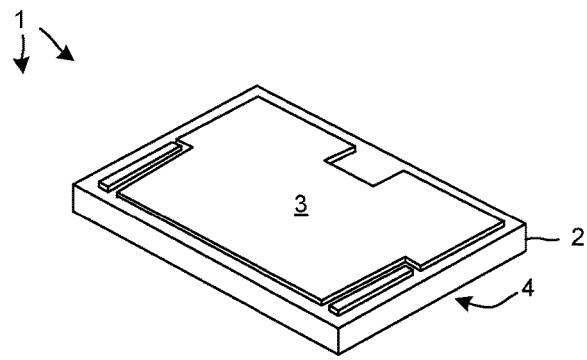
FIG. 1 is a perspective diagram of a Direct-Bonded Copper ("DBC") substrate.

FIG. 1 is a perspective diagram of a Direct-Bonded Copper ("DBC") substrate 1. DBC substrate 1 involves a substrate layer 2 of an insulative material. Substrate layer 2 is sandwiched between a first (die-side) layer 3 of metal and a second (back-side) layer 4 of metal. The second back-side metal layer 4 is not seen in the perspective view of FIG. 1 because it is located underneath the structure pictured. Arrow 4 indicates that this second back-side metal layer 4 is disposed on the bottom side of the substrate layer 2 in the perspective shown.

In one example, substrate layer 2 is a layer of an insulative material such as an insulative ceramic. In one example, the insulative ceramic is alumina (Al2O3) that is 0.630 mm thick. In one example, first die-side metal layer 3 is a layer of copper plated and a plating of a thin upper layer of nickel. Metal layer 3 is at least 0.25 mm thick (for example, 0.30 mm thick). The nickel plating (optional) is 10 micrometers thick. Metal layer 3 may be referred to as a die-attach pad. Similarly, second back-side metal layer 4 is a layer of copper and a plating of a thin upper layer of nickel. Layer 4 is at least 0.25 mm thick (for example, 0.30 mm thick). The nickel plating (optional) is 10 micrometers thick.

In one example, DBC substrate 1 is made by placing a first sheet of metal on top of the sheet of alumina, and placing a second sheet of metal under the sheet of alumina. The three sheets are then pressed together in a high temperature furnace such that the metal sheets are mechanically pressed and melted down and fixed to the top and bottom surfaces of the alumina. The outer surfaces of the metal layers take on the somewhat irregular non-planar surfaces of the alumina layer. Irregularities of the alumina transfer through the metal layer sheets. After pressing, the metal sheets are patterned and etched using standard lithographic and etching processes. The resulting etched structure is then sectioned into smaller rectangular pieces. FIG. 1 shows one of these rectangular pieces. The outer edges of the first die-side metal layer are set back from the outer edges of substrate layer 2 so that a later-applied encapsulant will better cover the side edges of the die-side metal layer. The width of substrate layer 2 is about 14.2 mm and the length of layer substrate 2 is about 17.0 mm.

Figure 2:
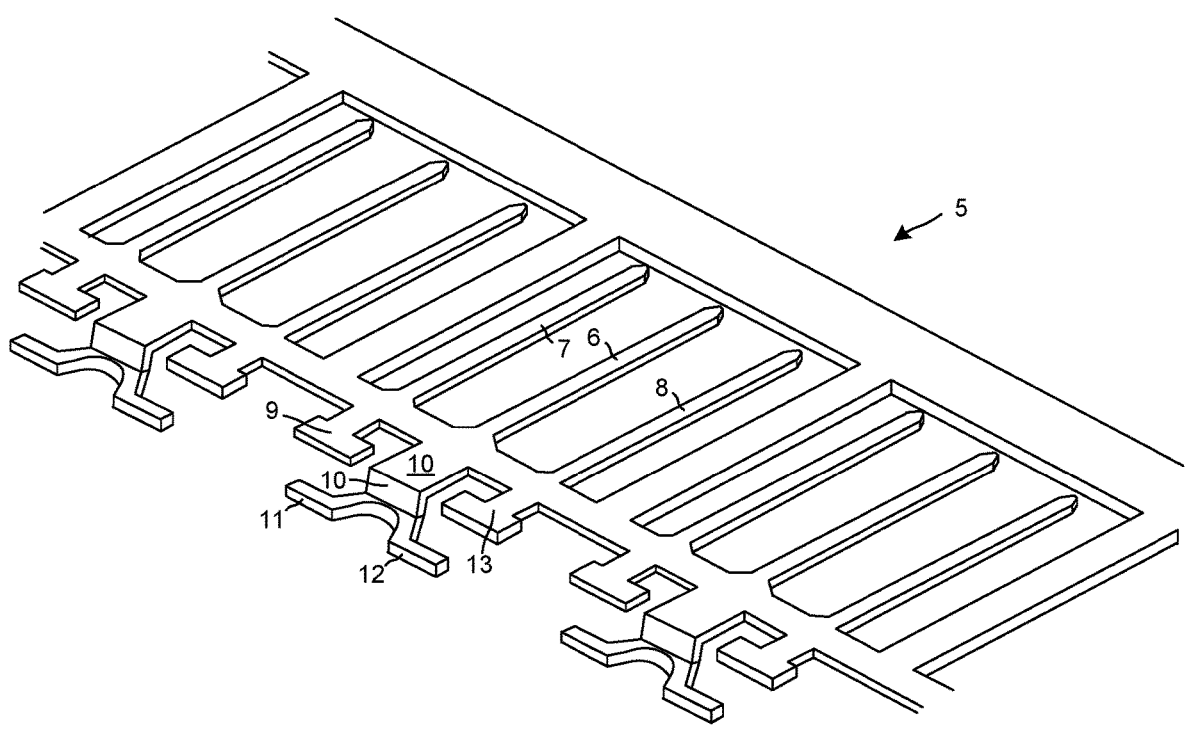
FIG. 2 is a perspective diagram of a leadframe.

FIG. 2 is a perspective diagram of a leadframe 5. Leadframe 5 is stamped from a single sheet of thick copper. The copper of the sheet is nickel plated. In another example, bare copper is used. A center portion of leadframe 5 involves a first lead portion 6, a second lead portion 7, and a third lead portion 8. Extending from the first lead portion 6 is a bent down extension portion 10 that terminates in two opposing finger-like contact pads 11 and 12. Extending from second lead portion 7 is a bonding extension portion 9. Extending from third lead portion 8 is a bonding extension portion 13.

Figure 3:
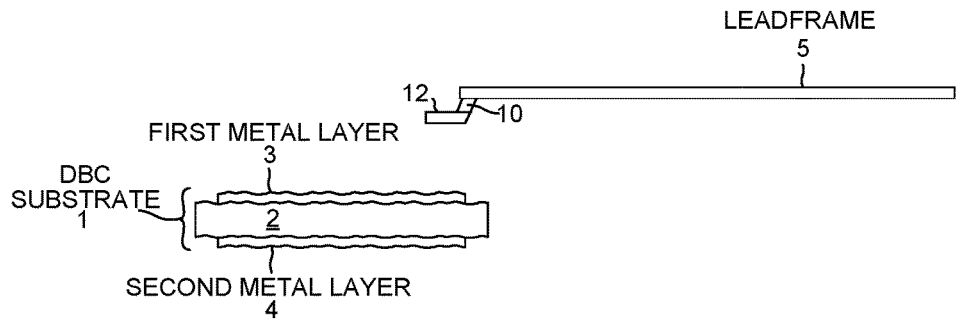
FIG. 3 is a cross-sectional showing the leadframe of FIG. 2 and the DBC substrate of FIG. 1 at the beginning of a package assembly process.

FIG. 3 is a cross-sectional diagram showing leadframe 5 and DBC substrate 1 at the beginning of a package assembly process.

Figure 4:
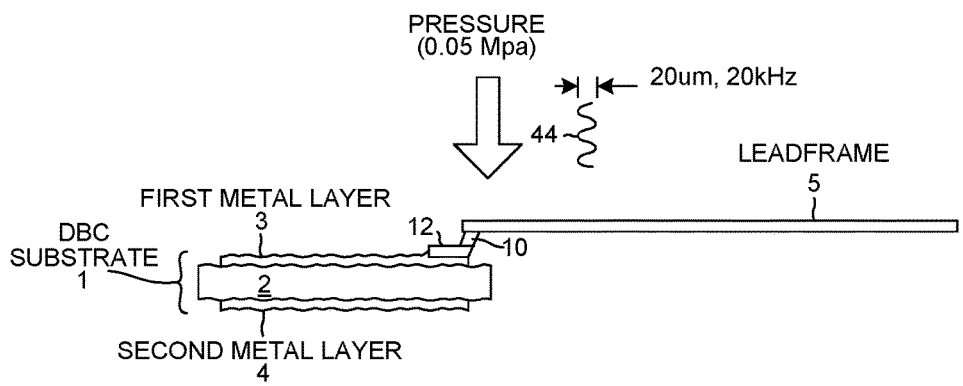
FIG. 4 is a cross-sectional diagram showing the leadframe and the DBC substrate at a subsequent time in the package assembly process.

FIG. 4 is a cross-sectional diagram showing leadframe 5 and DBC substrate 1 at a subsequent time in the package assembly process. The leadframe and the DBC substrate are brought together as illustrated so that each pair of leadframe contact pads makes contact with a corresponding DBC substrate. Each leadframe contact pad is then attached with a solderless weld to a corresponding portion of the first die-side layer of the associated DBC substrate. In one example, the solderless weld is an ultrasonic weld. Sinusoidal waveform 44 is a representation of the relative ultrasonic movement that causes the welding to occur.

Figure 5:
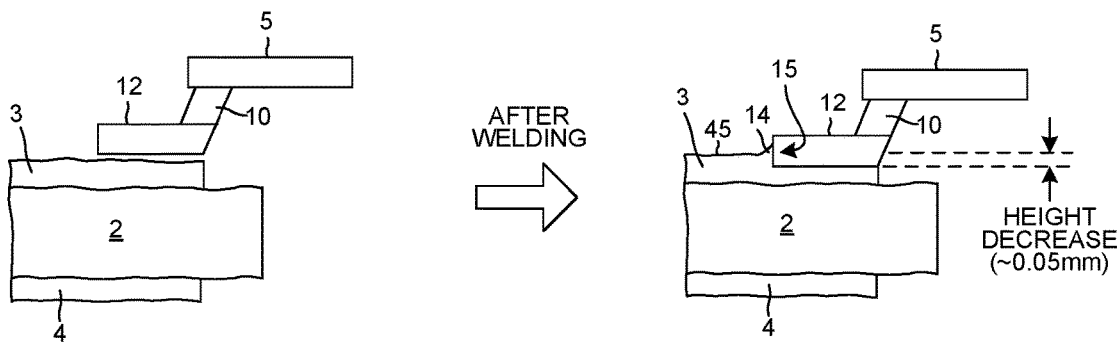
FIG. 5 is a cross-sectional diagram that shows a contact pad and the DBC substrate both immediately before ultrasonic welding and immediately after ultrasonic welding.

FIG. 5 is a cross-sectional diagram that shows contact pad 12 and the edge of first die-side metal layer 3 in further detail both immediately before ultrasonic welding and immediately after ultrasonic welding. As a result of the ultrasonic welding, contact pad 12 is pressed down into and past the upper surface 45 of first die-side layer 3 by approximately 0.05 millimeters. In one example, there is no solder disposed between the upper surface of first metal layer 3 and contact pad 12. As contact pad 12 is vibrated back and forth relative to DBC substrate 1 during the ultrasonic welding process, an amount of metal 14 may pile up at the side edge 15 of contact pad 12 as pictured in the right portion of FIG. 5. The weld is a solderless weld.

Previous nonpublic and non-commercial attempts to ultrasonically weld DBC substrates to leadframes in the TO-247 outline package set forth in U.S. Pat. No. 6,404,065 have been made. These attempts were, however, considered unsuccessful. Copper lift off as illustrated in FIG. 6 occurred. The leadframe 16 was ultrasonically welded to the die-side metal layer 17 but the ultrasonic energy used caused the die-side metal layer 17 to separate in places from the ceramic layer 18 of the DBC substrate. In some cases, the leadframe 19 was ultrasonically welded to the die-side metal layer 20 but the alumina substrate 21 cracked as illustrated in FIG. 7 occurred. Reference numerals 41-43 identify representations of three such cracks.

FIG. 8 is a table that sets forth parameters of the ultrasonic welding process used to attach DBC substrates to leadframe contact pads in accordance with one novel aspect. In one example, each ultrasonic weld is carried out using 20 kHz ultrasonic vibrations, having a peak-to-peak vibration amplitude of less than or equal to approximately 20 micrometers, for 0.25 seconds, under a welding pressure of not more than 0.05 Mpa. When the parameters of FIG. 8 are used in the ultrasonic welding process, little or none of the lift off and cracking illustrated in FIG. 6 and FIG. 7 are seen to occur. After ultrasonic welding of DBC substrates to the leadframe, a single power integrated circuit die is attached to the die-side metal layer of each DBC substrate. The single power integrated circuit die may, for example, be a power rectifier die, a power regulator die, a silicon controlled rectifier die, a power bipolar transistor integrated circuit die, a power insulated gate bipolar transistor circuit die, or a power field effect transistor integrated circuit die.

Next, bond pads on the top surfaces of the integrated circuit dice are wire bonded in conventional fashion to the corresponding wire bond portions of the corresponding leads of the leadframe. After wire bonding, each die is overmolded with an amount of plastic encapsulant in conventional fashion. The back-side metal layer of each DBC substrate is, however, left at least partially exposed and is not entirely overmolded. After encapsulation, conventional lead trimming is performed to cut individual TO-247 packaged devices from the leadframe. The wirebonding, the overmolding with encapsulant, and the trimming of interconnection portions of the leadframe to make the individual packaged devices are processes known in the art.

Figure 9:
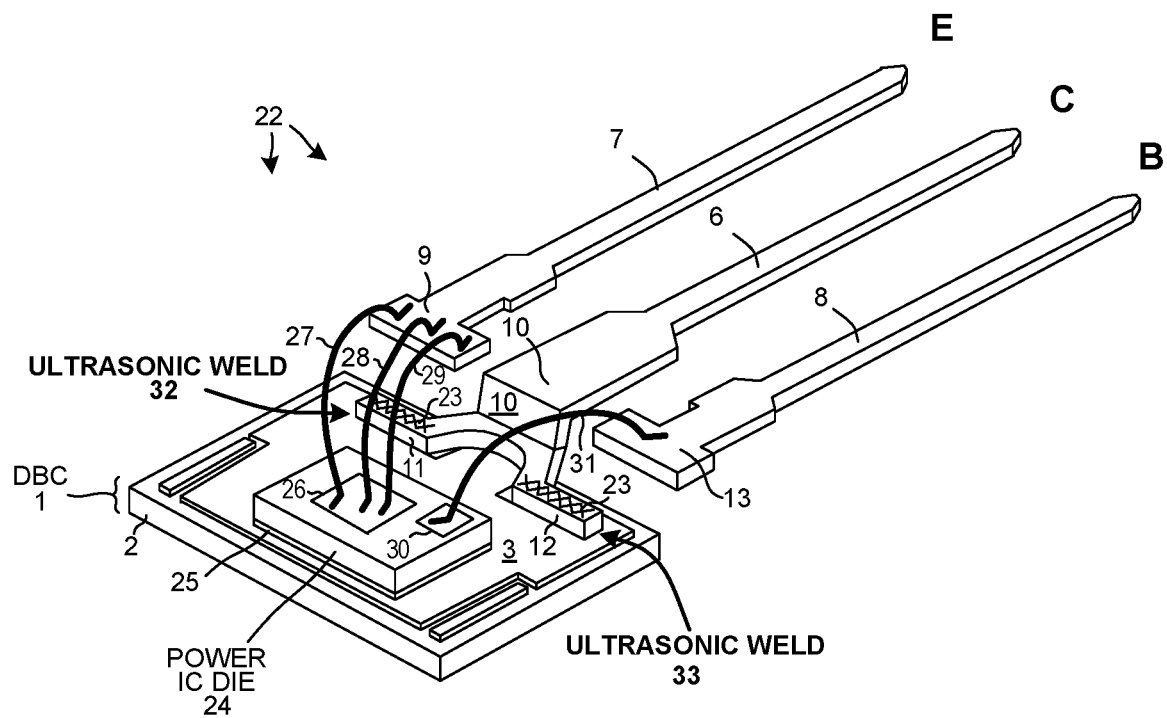
FIG. 9 is a perspective view of a finished TO-247 packaged discrete power integrated circuit device, where the DBC substrate within the package is ultrasonically welded to contact pads of the center lead (the plastic encapsulant overmolding is not shown).

FIG. 9 is a perspective view of one such finished TO-247 packaged device 22 with its plastic encapsulant overmolding not shown. The upper surfaces of contact pads 11 and 12 have nonplanar waffle-like indentations and contours 23. The indentations may be of the shape of intersecting rows and columns of V-shaped trenches. These indentations and contours 23 are a result of the force applied by an ultrasonic welding head. During the compressive force of the ultrasonic welding process, teeth or ridges on the bottom of the ultrasonic head cut down into the upper surface of the contact pads, thereby leaving the waffle-like indentations that correspond to the shape of the teeth or ridges. The type of marks left need not be waffle-like indentations rather may be nonplanar structures of another shape depending on the structure of the gripping bottom surface of the ultrasonic head.

One and only one power semiconductor integrated circuit die 24 is die-attached to the first die-side metal layer 3 of DBC substrate 1. In the illustrated example, integrated circuit 24 is a discrete power bipolar transistor integrated circuit die. The bottom side of die 24 is the collector electrode 25. Collector electrode 25 is electrically and mechanically connected to the upper surface of the first die-side metal layer 3, and through this layer of metal and through contact pads 11 and 12, and bent down extension portion 10, to the center lead 6 of the TO-247 packaged device 22. An emitter contact pad 26 on the upper surface of die 24 is electrically coupled via multiple aluminum bond wires 27-29 to the lead extension portion 9 of packaged device 22. A base contact pad 30 on the upper surface of die 24 is electrically coupled via bond wire 31 to lead extension portion 13 of packaged device 22. The emitter and base leads 7 and 8 are held in place in the positions illustrated in FIG. 9 by the plastic encapsulant. The locations of the ultrasonic welds at the interfaces between the bottom of contact pads 11 and 12 and the top surface of die-side metal layer 3 are roughly identified by arrows 32 and 33.

Figure 10:
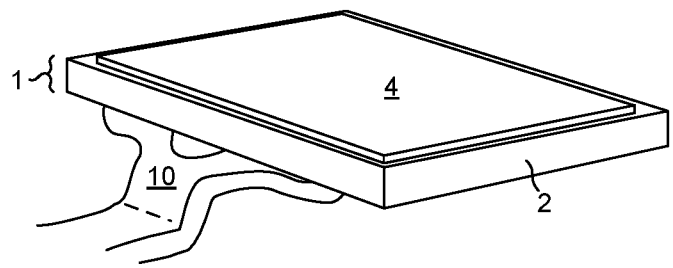
FIG. 10 is a diagram of the bottom of the device of FIG. 9 showing the DBC substrate and the bent down extension portion of the center lead (the encapsulant, the emitter and base leads, and the associated bond wires are not shown).

FIG. 10 is a diagram of the bottom of the device of FIG. 9, showing the DBC substrate 1 and bent down extension portion 10 of the center lead. The encapsulant, the emitter and base leads, and the associated bond wires, are not shown in the simplified diagram of FIG. 10.

Figure 11:
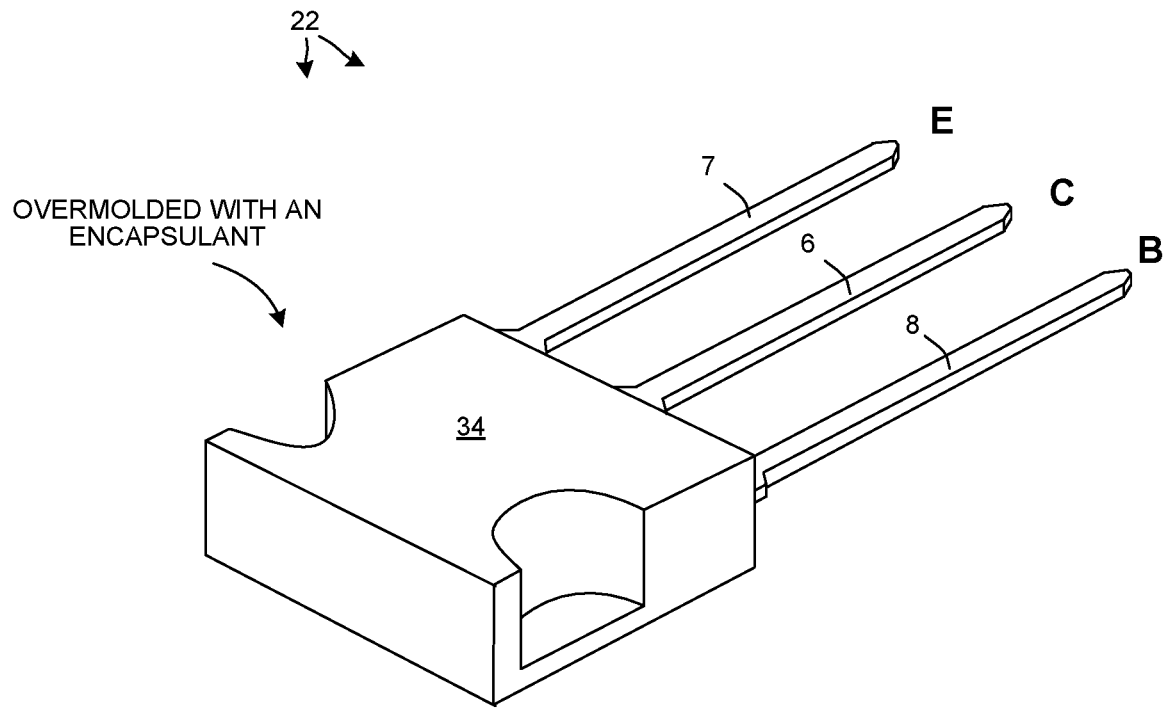
FIG. 11 is a simplified perspective diagram of a finished TO-247 device, where the DBC substrate is attached to the contact pads of the center lead with a solderless weld in accordance with one novel aspect. The first, second and third leads extend parallel to one another from the amount of encapsulant 34.

FIG. 11 is a simplified perspective diagram of the finished TO-247 device 22. The amount of plastic encapsulant 34 is shown. This encapsulant 34 covers the die 24, the bond wires 27-29 and 31, and the upper die-side metal layer 3 of the DBC substrate 1. The back-side metal layer 4 of DBC substrate 1 is not covered with encapsulant, but rather is exposed and forms the backside of the packaged device 22.

This back-side metal layer 4 is not shown in FIG. 11 because it is the bottom side of the device pictured in the FIG. 11.

Figure 12:
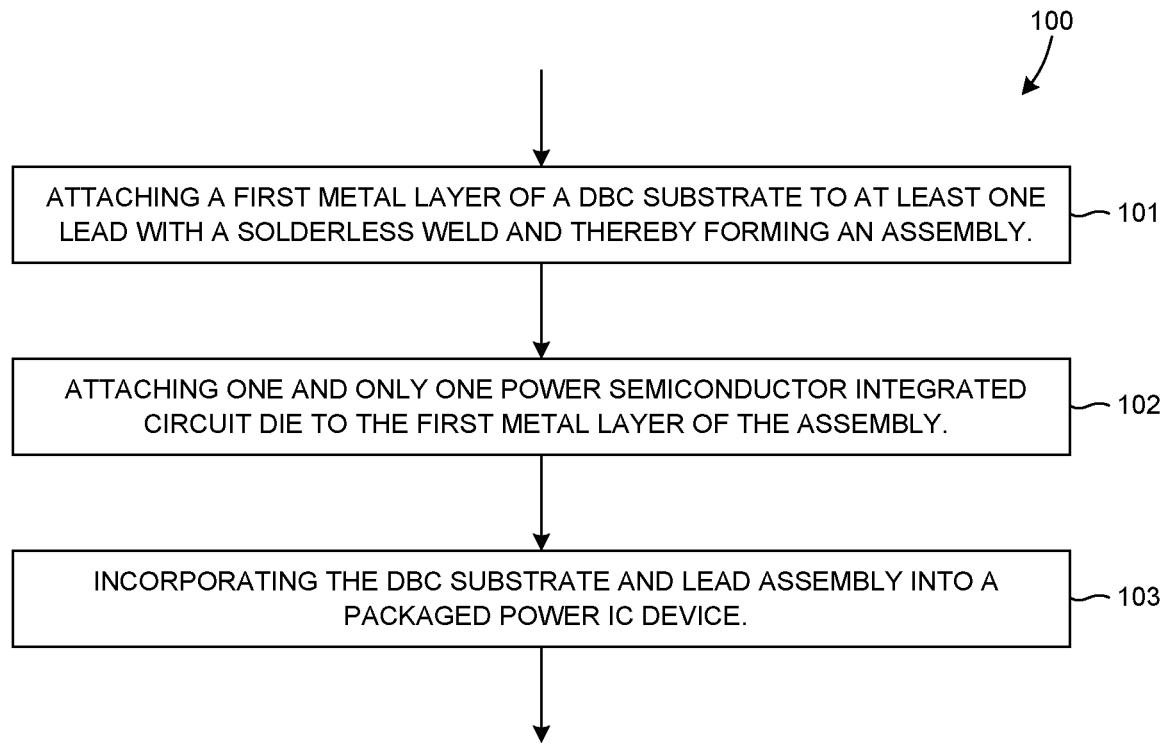
FIG. 12 is a flowchart of a method in accordance with one novel aspect.

FIG. 12 is a flowchart of a method 100 in accordance with one novel aspect. A first metal layer of a DBC substrate is attached to at least one lead with a solderless weld, thereby forming an assembly (step 101). The solderless weld may be an ultrasonic weld. The solderless weld may be a laser weld. In one example, a first of the leads is a lead involving contact pads 11 and 12, bent portion 10, and lead portion 7; a second of the leads is a lead involving portion 9 and lead portion 6; and a third of the leads is a lead involving portion 13 and lead portion 8. In another step (step 102), one and only one power semiconductor integrated circuit is attached to the first metal layer of the assembly. The resulting DBC substrate and lead assembly is then incorporated (step 103) into a packaged power integrated circuit device. In one example, this incorporation involves wire bonding the die to the second and third leads, involves encapsulating the die and DBC/lead assembly, and involves lead trimming to form the resulting packaged power integrated circuit device. In one example, the resulting packaged power integrated circuit device conforms to the TO-247 outline and is the package 22 of FIG. 11.

FIG. 13 is a diagram of a second way that DBC substrate 1 can be connected to contact pads 11 and 12 with a solderless weld. Rather than being ultrasonically welded, laser light source device 35 and laser light 36 are used to laser weld contact pads 11 and 12 to the die-side metal layer 3 of DBC substrate 1. Laser light 36 provides localized heating to carry out the weld. The term "laser" is used here loosely. Energy from a high energy light source (whether laser light or another type of light) is used to heat small localized portions of contact pads 11 and 12 and thereby to weld the contact pads to the underlying metal layer 3. In one example, there is no intervening solder disposed between the contact pads 11 and 12 and the underlying metal layer 3. The weld is a solderless weld.

FIG. 14 is a perspective view of a finished packed integrated circuit device 37 without its amount of encapsulant overmolding. The structure 37 of FIG. 14 is similar to the structure of FIG. 9, except that in the case of the structure 37 of FIG. 14 the contact pads 11 and 12 have been laser welded to DBC substrate 1. The upper surface of each of contact pads 11 and 12 is has a row of five mound-shaped protrusions and corresponding pits. Reference numeral 38 identifies the right most such mound-shaped protrusion and pit structure on the top surface of contact pad 12. Each mound and pit structure is formed as a result of application of pulses of laser energy. The pulses of laser energy locally heat part of a contact pad to a molten state and cause it to fuse to a part of the upper surface of die-side metal layer 3 of the DBC substrate. The locations of the laser welds at the interfaces between the bottom of contact pads 11 and 12 and the top surface of die-side metal layer 3 are roughly identified by arrows 39 and 40.

FIG. 15 is a table that sets forth parameters of the laser welding process used to weld the DBC substrate 1 of FIG. 14 to the contact pads 11 and 12 of FIG. 14 to make the packaged device of FIG. 14.

In one example, the packaged semiconductor device, the DBC substrate of the packaged semiconductor device, and the leads of the packaged semiconductor device are as described in U.S. Pat. No. 6,404,065. The packaged semiconductor device may conform to a package outline, such as the TO-220 outline, the TO-264 outline, or the SOT-227B outline. For additional information on the packaged semiconductor device, and for additional detail on its constituent parts and how to make them, see: U.S. Pat. Nos. 6,404,065, 4,483,810, and 6,727,585 (the entire subject matter of each of these three patent documents is incorporated herein by reference).

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

We claim:

1. A method comprising:
   attaching a first metal layer of a direct-bonded copper ("DBC") substrate to at least one lead with an ultrasonic weld to form an assembly, wherein the ultrasonic weld mechanically and electrically couples the first metal layer to the lead, wherein the DBC substrate comprises an insulative layer disposed between the first metal layer and a second metal layer,
   wherein the at least one lead comprises a contact pad, having an upper surface and a lower surface, wherein the at least one lead is joined to the first metal layer through the lower surface of the contact pad, and wherein the ultrasonic weld comprises applying an ultrasonic head to the upper surface of the contact pad, wherein a plurality of non-planar structures are generated on the upper surface;
   attaching a power semiconductor integrated circuit die to the first metal layer of the assembly;
   surrounding at least the first metal layer and the power semiconductor integrated circuit die with an amount of encapsulant;
   leaving at least a portion of the second metal layer of the DBC substrate exposed to form a back side of a packaged power integrated circuit device; and
   leaving a portion of the lead exposed, wherein the second metal layer is electrically insulated from the first metal layer.

2. The method of claim 1, wherein the packaged power integrated circuit device conforms to a TO-247 package outline.

3. The method of claim 1, wherein the ultrasonic weld is formed by clamping the DBC substrate and the at least one lead together with not more than about 0.05 Mpa.

4. The method of claim 1, wherein the ultrasonic weld is formed using ultrasonic vibrations of an amplitude of less than approximately 20 micrometers.

5. The method of claim 1, wherein the ultrasonic weld decreases a thickness of a region of the first metal layer in contact with the at least one lead by about 0.05 millimeters.

6. The method of claim 1, wherein the first metal layer has a thickness of at least 0.25 millimeters.

7. The method of claim 1, the attaching comprising attaching one and only one power semiconductor integrated circuit die.

* * * * *